(12) United States Patent
Zhu

(10) Patent No.: US 7,960,264 B2
(45) Date of Patent: Jun. 14, 2011

(54) LITHOGRAPHY FOR PRINTING CONSTANT LINE WIDTH FEATURES

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/901,148

(22) Filed: Oct. 8, 2010

(65) Prior Publication Data

US 2011/0018039 A1    Jan. 27, 2011

Related U.S. Application Data

(62) Division of application No. 11/947,929, filed on Nov. 30, 2007, now Pat. No. 7,863,169.

(51) Int. Cl.
*H01L 21/22* (2006.01)
*H01L 21/302* (2006.01)

(52) U.S. Cl. ......... 438/514; 438/149; 438/187; 257/534

(58) Field of Classification Search .................. 257/301; 438/149, 150, 168, 187, 198, 733, FOR. 259, 438/FOR. 117
See application file for complete search history.

(56) References Cited

U.S. PATENT DOCUMENTS

| 4,102,714 | A  | 7/1978  | DeBar et al. |
|-----------|----|---------|--------------|
| 5,374,564 | A  | 12/1994 | Bruel |
| 5,714,395 | A  | 2/1998  | Bruel |
| 6,372,609 | B1 | 4/2002  | Aga et al. |
| 6,464,842 | B1 | 10/2002 | Golovchenko et al. |
| 6,583,010 | B2 | 6/2003  | Mo |
| 6,613,678 | B1 | 9/2003  | Sakaguchi et al. |
| 6,787,052 | B1 | 9/2004  | Vaganov |
| 6,846,744 | B1 | 1/2005  | Chen |
| 6,864,041 | B2 | 3/2005  | Brown et al. |
| 7,026,247 | B2 | 4/2006  | Dolumaci et al. |
| 7,081,399 | B2 | 7/2006  | Maleville et al. |
| 7,312,158 | B2 | 12/2007 | Miyagawa et al. |
| 2002/0187619 | A1 | 12/2002 | Kleinhenz et al. |
| 2007/0017899 | A1 | 1/2007  | LaBrake |

OTHER PUBLICATIONS

Weber et al., "A Novel Locally Engineered (111) V-channel pMOSFET Architecture with Improved Drivability Characteristics for Low-Standby power (LSTP) CMOS Applications", 2005 Symposium on VLSI Technology Digest of Technical Papers, 2005, pp. 156-157.

Sekimura, M., "Anisoptropic Etching of Surfactant-Added TMAH Solution", Mechanical Systems Research Laboratories, Toshiba Corp., IEEE, 1999, pp. 650-655.

*Primary Examiner* — Thanh V Pham
*Assistant Examiner* — Mohammad Choudhry
(74) *Attorney, Agent, or Firm* — Scully, Scott, Murphy & Presser, P.C.; Ian D. MacKinnon, Esq.

(57) ABSTRACT

An anisotropic wet etch of a semiconductor layer generates facets joined by a ridge running along the center of a pattern in a dielectric hardmask layer on the semiconductor layer. The dielectric hardmask layer is removed and a conformal masking material layer is deposited. Angled ion implantation of Ge, B, Ga, In, As, P, Sb, or inert atoms is performed parallel to each of the two facets joined by the ridge causing damage to implanted portions of the masking material layer, which are removed selective to undamaged portions of the masking material layer along the ridge and having a constant width. The semiconductor layer and a dielectric oxide layer underneath are etched selective to the remaining portions of the dielectric nitride. Employing remaining portions of the dielectric oxide layer as an etch mask, the gate conductor layer is patterned to form gate conductor lines having a constant width.

5 Claims, 16 Drawing Sheets

LITHOGRAPHY FOR PRINTING CONSTANT LINE WIDTH FEATURES

CROSS REFERENCE TO RELATED APPLICATION

This application is a divisional of U.S. patent application Ser. No. 11/947,929, filed Nov. 30, 2007, now U.S. Pat No. 7,863,169, the entire content and disclosure of which is incorporated herein by reference.

FIELD OF THE INVENTION

The present invention relates to methods of manufacturing semiconductor devices, and particularly to lithography for printing constant line width features independent of dimensional variations in an image of a developed photoresist.

BACKGROUND OF THE INVENTION

With the continuous scaling of feature sizes in the semiconductor device technology, conventional lithography faces extreme challenges since the pace of the development of new lithographic tools lags behind the pace of reduction in the minimum feature size. While manipulation of images such as use of sublithographic assist features (SLAFs) and optical proximity effect correction has provided some relief to assist printing of images on a photoresist with improved fidelity and at a reduced critical dimension (CD), i.e., the minimum printable feature size, line width variations within a chip and across a substrate plague attempts to reliably and repeatably print lithographic images having a dimension close to the minimum printable feature size. Such challenge is inherent in the lithography currently employed in the semiconductor industry since any lithography tool has an inherent non-uniformity in image production due to mechanical factors such as lens aberration and chemical factors in the uniformity of the photoresist coating.

Further, significant delays have occurred in the development of lithographic tools that were planned to provide adequate lithographic capabilities beyond 45 nm node of the semiconductor technology. Such lithographic tools employ extreme ultraviolet (EUV) lithography or electron beam (e-beam) lithography, neither of which has provided a commercially viable and reliable lithography system. However, for the scaling of features sizes to continue in the semiconductor industry, reliable methods of producing feature sizes less than 45 nm, and preferably less than 30 nm is required.

In view of the above, there exists a need for a novel method for reliably providing feature sizes that are smaller than those that are currently available.

Further, as the dimension of feature sizes shrink in semiconductor devices, small variations in the feature size induce substantial variations in device performance. Thus, there exists a need for lithographic methods for printing constant line width features independent of dimensional variations in an image of a developed photoresist.

SUMMARY OF THE INVENTION

The present invention addresses the needs described above by providing a method of printing features of constant line width independent of dimensional variations in an image of a developed photoresist and structures for effecting the same.

According to the present invention, a gate dielectric layer, a gate conductor layer, and a dielectric oxide layer are formed on a first semiconductor substrate containing shallow trench isolation structures. A second semiconductor substrate is bonded to the surface of the dielectric oxide layer and subsequently cleaved to provide a semiconductor layer located directly on the dielectric oxide layer. A dielectric hardmask layer is formed on the surface of the semiconductor layer and lithographically patterned. An anisotropic wet etch of the semiconductor layer generates facets joined by a ridge running along the center of the pattern in the dielectric hardmask layer. The dielectric hardmask layer is removed and a conformal masking material layer is deposited. Angled ion implantation of Ge, B, Ga, In, As, P, Sb, or inert atoms is performed parallel to each of the two facets joined by the ridge causing damage to implanted portions of the masking material layer, which are removed selective to undamaged portions of the masking material layer along the ridge and having a constant width irrespective of dimensional variations in the pattern of the opening in the dielectric hardmask layer. Employing the remaining portions of the dielectric nitride as an etch mask, the semiconductor layer and the dielectric oxide layer are etched. Employing remaining portions of the dielectric oxide layer as an etch mask, the gate conductor layer is patterned to form gate conductor lines having a constant width. Source and drain regions and spacers may be formed to provide transistors having constant width gate lines.

According to an aspect of the present invention, a method of forming a semiconductor structure is provided, which comprises:

forming a stack, from bottom to top, of a gate dielectric layer, a gate conductor layer, a dielectric oxide layer, and a semiconductor layer on a semiconductor substrate;

forming crystallographic facets joined by a ridge in the semiconductor layer by an anisotropic wet etch;

forming a masking material layer on the crystallographic facets; and forming implantation-damaged masking material portions by implanting Ge, B, Ga, In, As, P, Sb, or inert atoms into the masking material layer, whereby a portion of the masking material layer is not implanted by the Ge, B, Ga, In, As, P, Sb, or inert atoms to form an undamaged masking material portion.

The masking material layer may comprise a dielectric nitride or an undoped silicon-containing-semiconductor material.

In one case, the implantation-damaged masking material portion may comprise a dielectric nitride and at least one of Ge or inert atoms, and the implantation-damaged masking material portion has more structural damage than the undamaged masking material portion.

Alternately, the implantation-damaged masking material portion may comprise an undoped silicon-containing-semiconductor material and at least one of Ge, B, Ga, In, As, P, and Sb, wherein the undamaged masking material portion is substantially undoped.

In one embodiment, the Ge, B, Ga, In, As, P, Sb, or inert atoms are implanted at a first angle that is substantially parallel to one of the crystallographic facets adjoined to the ridge and at a second angle that is substantially parallel to another of the crystallographic facets adjoined to the ridge.

In another embodiment, a vertical cross-sectional area of the undamaged masking material portion is a rhombus. The rhombus may have a sublithographic width.

In even another embodiment, the method further comprises removing the implantation-damaged masking material portions selective to the undamaged masking material portion.

In yet another embodiment, the method further comprises etching the semiconductor layer and the dielectric oxide layer employing the undamaged masking material portion as an etch mask.

In still another embodiment, the method further comprises etching the gate conductor layer employing at least one of the undamaged masking material portion and a remaining portion of the dielectric oxide layer as an etch mask.

In still yet another embodiment, the method further comprises forming a field effect transistor employing a remaining portion of the gate conductor layer as a gate conductor of the field effect transistor.

In a further embodiment, the method further comprises:
forming a dielectric hardmask layer directly on the semiconductor layer; and
forming an opening in the dielectric hardmask layer, wherein the crystallographic facets are formed underneath the opening.

In an even further embodiment, the dielectric hardmask layer comprises one of silicon oxide, silicon oxynitride, and silicon nitride.

In a yet further embodiment, an edge of each of the crystallographic facets is directly adjoined to an edge of the opening in the dielectric hardmask layer.

In still further embodiment, the method further comprises:
applying a photoresist on the dielectric hardmask layer;
lithographically patterning the photoresist; and
etching an exposed portion of the dielectric hardmask layer to form the opening employing the photoresist as an etch mask.

In still yet further embodiment, surface orientations of the crystallographic facets are one of {100} orientations, {110} orientations, {111} orientations, {211} orientations, {221} orientations, and {311} orientations.

In further another embodiment, the surface orientations of the crystallographic facets are {111} orientations.

In even further another embodiment, the semiconductor layer is formed by bonding another semiconductor substrate containing a hydrogen implanted layer to the dielectric oxide layer and cleaving the another semiconductor substrate along the hydrogen implanted layer, and a portion of the another semiconductor substrate between the dielectric oxide layer and the hydrogen implanted layer constitutes the semiconductor layer.

In yet further another embodiment, the masking material layer comprises silicon nitride.

In still further another embodiment, the masking material layer is formed by a conformal chemical vapor deposition.

In still yet further another embodiment, the gate conductor layer comprises a polycrystalline or amorphous semiconductor material, and wherein the semiconductor substrate and the semiconductor layer comprise single crystalline semiconductor materials.

According to another aspect of the present invention, a semiconductor structure is provided which comprises:
a stack located on a semiconductor substrate and comprising, from bottom to top, a gate dielectric layer, a gate conductor layer, a dielectric oxide layer, and a semiconductor layer, wherein the semiconductor layer contains a pair of crystallographic facets joined by a ridge; and
an undamaged masking material portion located directly on the ridge and having a vertical cross-sectional area of a rhombus.

In one embodiment, the semiconductor structure further comprises implantation damaged masking material portions containing Ge, B, Ga, In, As, P, Sb, or inert atoms and abutting one of the pair of crystallographic facets and the undamaged masking material portion, wherein the undamaged masking material portion does not contain Ge, B, Ga, In, As, P, Sb, or inert atoms.

In another embodiment, the semiconductor layer contains a horizontal surface vertically abutting one of the implantation-damaged masking material portions.

In yet another embodiment, the undamaged masking material portion and the implantation-damaged masking material portions differ in composition only by the Ge or the inert atoms.

In still yet another embodiment, the inert atoms comprise at least one of Ne, Ar, Kr, Xe, and Rn.

In a further embodiment, the semiconductor structure further comprises at least one shallow trench isolation structure comprising a dielectric material and located in the semiconductor substrate.

In an even further embodiment, surface orientations of the crystallographic facets are one of {100} orientations, {110} orientations, {111} orientations, {211} orientations, {221} orientations, and {311} orientations.

In a yet further embodiment, the semiconductor substrate comprises single crystalline semiconductor material that abuts the gate dielectric layer.

In a still further embodiment, the rhombus has a sublithographic width.

DETAILED DESCRIPTION OF THE INVENTION

As stated above, the present invention relates to methods of manufacturing semiconductor devices, and particularly to lithography for printing constant line width features independent of dimensional variations in an image of a developed photoresist, which is now described in detail with accompanying figures.

Figure 1:
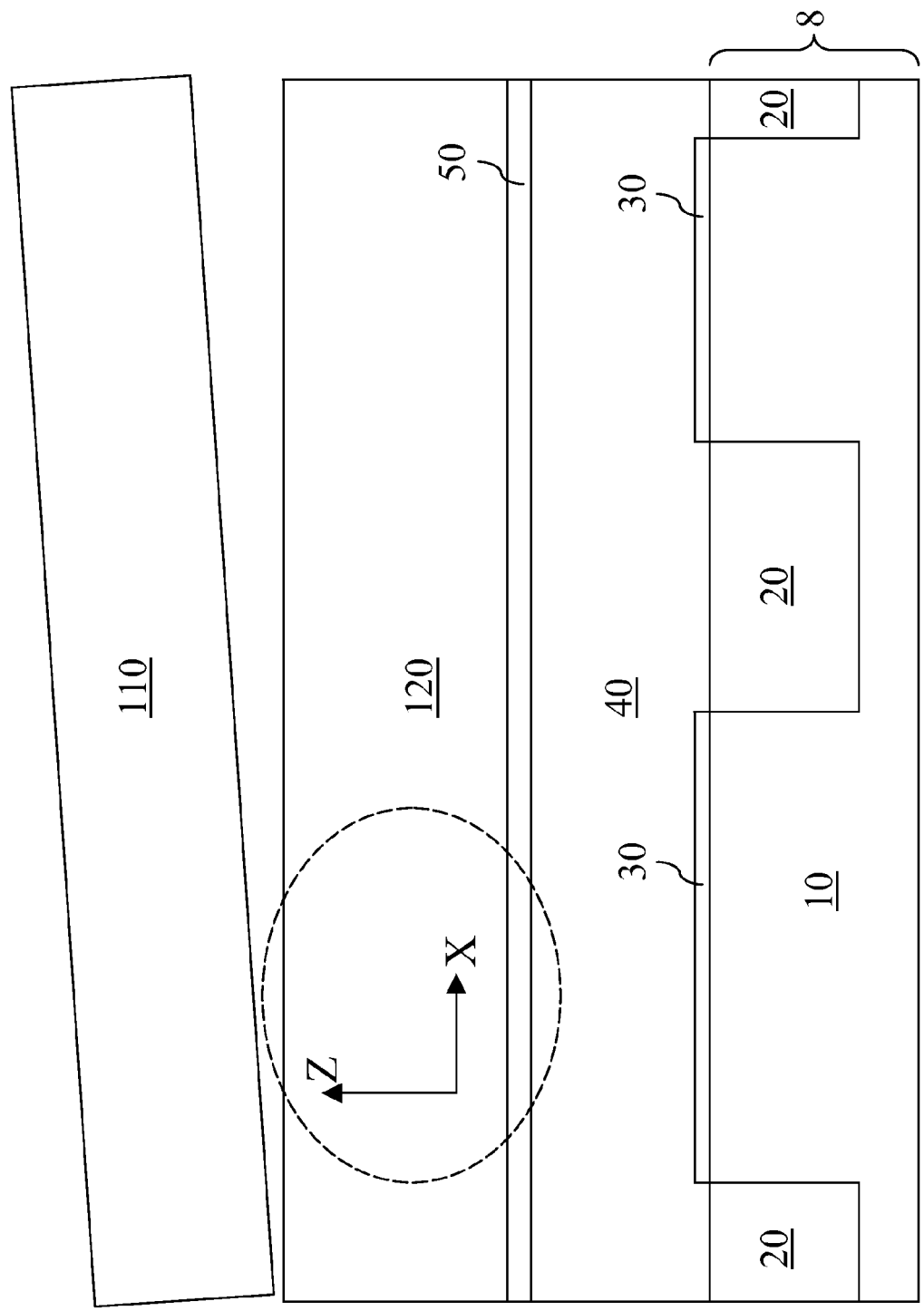
FIGS. 1-3, 4A, 5, 6A, 7-9, 10A, and 11-13 are sequential vertical cross-sectional views illustrating the processing steps for manufacturing an exemplary semiconductor structure according to the present invention.

Referring to FIG. 1, a first semiconductor substrate 8 containing shallow trench isolation structures 20 embedded in a first semiconductor layer 10 is provided. The first semiconductor substrate 8 may be a bulk substrate, a semiconductor-on-insulator (SOI) substrate, or a hybrid substrate. Non-limiting examples of the semiconductor material comprising the semiconductor layer 10 include silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Non-limiting examples of the surface orientation of the semiconductor layer 10, which is the crystallographic orientation of a top surface of the semiconductor layer 10, include (100), (110), (111), (211), (221), (311), (321), and (331). The surface orientation of the first semiconductor layer 10 may be selected to optimize performance of devices to be formed thereupon.

A gate dielectric layer 30 is formed on the semiconductor substrate 8. The gate dielectric layer 30 may comprise a silicon oxide based dielectric material such as thermally grown silicon oxide or silicon oxynitride. Alternately, the gate dielectric layer 30 may comprise a high dielectric constant (high-k) material which is a dielectric metal oxide containing a metal and oxygen. Preferably, the dielectric constant of the high-k dielectric material is greater than the dielectric constant of silicon nitride, which is about 7.5. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. Optionally, an interfacial layer (not shown), for example, silicon oxide, can be formed by chemical oxidation or thermal oxidation before the high-k dielectric material is deposited.

A gate conductor layer 40 comprising a conductive semiconductor material is formed on the gate dielectric layer 30. The gate conductor layer 40 may comprise a polycrystalline or amorphous semiconductor material such as polysilicon or a polycrystalline or amorphous silicon germanium alloy. Alternately, the gate conductor layer may comprise a metal gate stack containing a metallic layer (not shown) and a polycrystalline or amorphous semiconductor material layer (not shown). The metallic layer may comprise one of W, Ta, TiN, ZrN, HfN, VN, NbN, TaN, WN, TiAlN, TaC, TaMgC, TaCN, other conductive refractory metal nitrides, and an alloy thereof. The metallic layer may be formed directly on the gate dielectric layer 30 by chemical vapor deposition (CVD), physical vapor deposition (PVD), atomic layer deposition (ALD), vacuum evaporation, etc. The polycrystalline or amorphous semiconductor material layer comprises a polycrystalline or amorphous semiconductor material.

A dielectric oxide layer 50 comprising a dielectric oxide material is formed on the gate conductor layer 40. The dielectric oxide layer 50 may comprise thermal silicon oxide in case the gate conductor layer 40 comprises silicon. Alternately, the dielectric oxide layer 50 may comprise a dielectric oxide formed by chemical vapor deposition. In this case, the dielectric oxide layer 50 may comprise a doped or undoped silicate glass that may be formed by chemical vapor deposition. The thickness of the dielectric oxide layer 50 may be from about 5 nm to about 300 nm, and typically from about 30 nm to about 100 nm.

Figure 2:
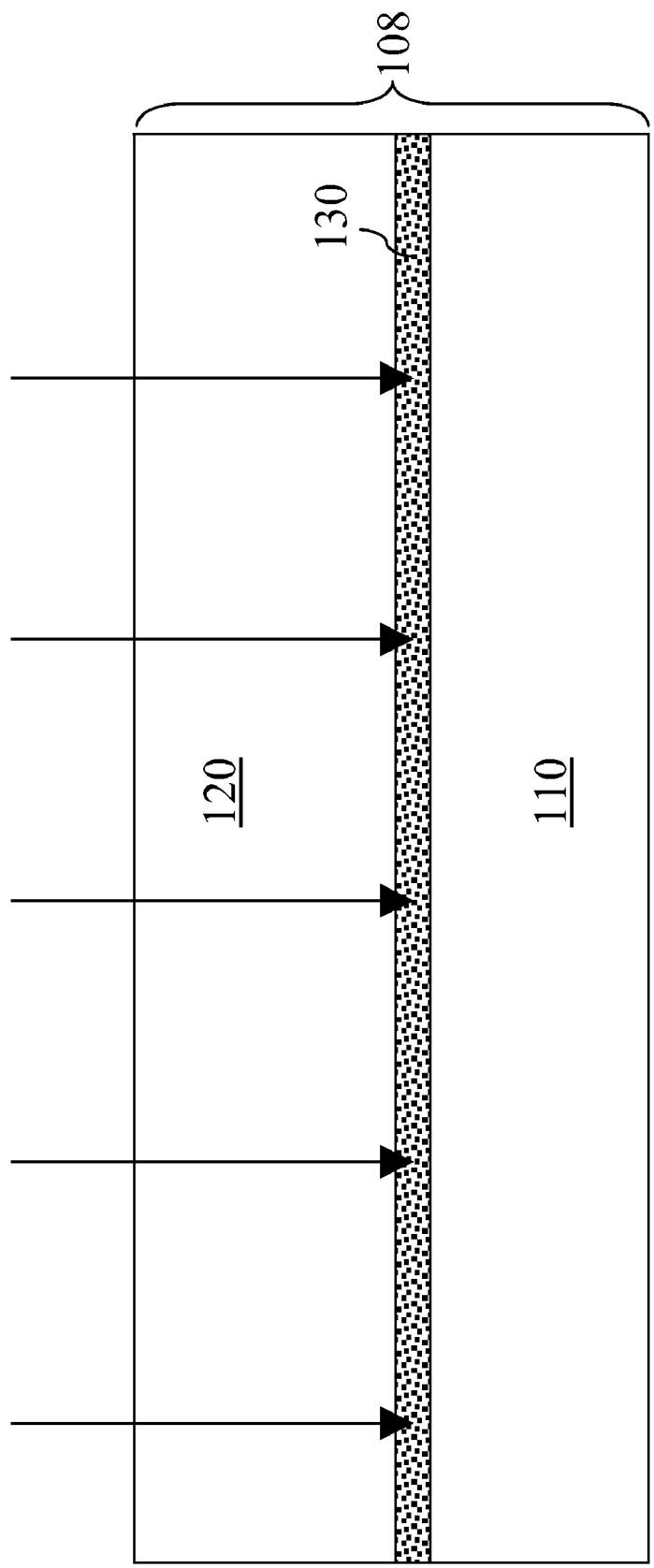

Referring to FIG. 2, a second semiconductor substrate 108 comprising a single crystalline semiconductor material is provided. Non-limiting examples of the semiconductor material of the second semiconductor substrate 108 include silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Non-limiting examples of the surface orientation of the second semiconductor substrate 108, which is the crystallographic orientation of the top surface, which is the same as the crystallographic orientation of the bottom surface, of the second semiconductor substrate 108, include (100), (110), (111), (211), (221), (311), (321), and (331). The surface orientation of the second semiconductor layer 108 may be selected to optimize the surface orientations of crystallographic facets to be subsequently formed therein.

Molecular hydrogen ions ($H_2^+$) or atomic hydrogen ions ($H^+$) are implanted into a second semiconductor substrate 108 to form a hydrogen implanted layer 130. The second semiconductor substrate 108 is separated into a second semiconductor layer 120 and a third semiconductor layer 110 by the hydrogen implanted layer 130. The thickness of the second semiconductor layer 120 may be from about 20 nm to about 400 nm, and preferably from about 50 nm to about 150 nm, although lesser and greater thicknesses are explicitly contemplated herein also. Processes and conditions for forming the hydrogen implantation layer 130 are well known to those skilled in the art. For example, the various separation by hydrogen implantation processes and conditions described in U.S. Pat. Nos. 5,374,564 and 5,714,395 to Bruel, U.S. Pat. No. 6,372,609 to Aga et al., U.S. Pat. No. 6,613,678 to Sagaguchi et al., U.S. Pat. No. 7,081,399 to Maleville et al. may be employed, the entire contents of which are incorporated herein by reference.

Figure 3:
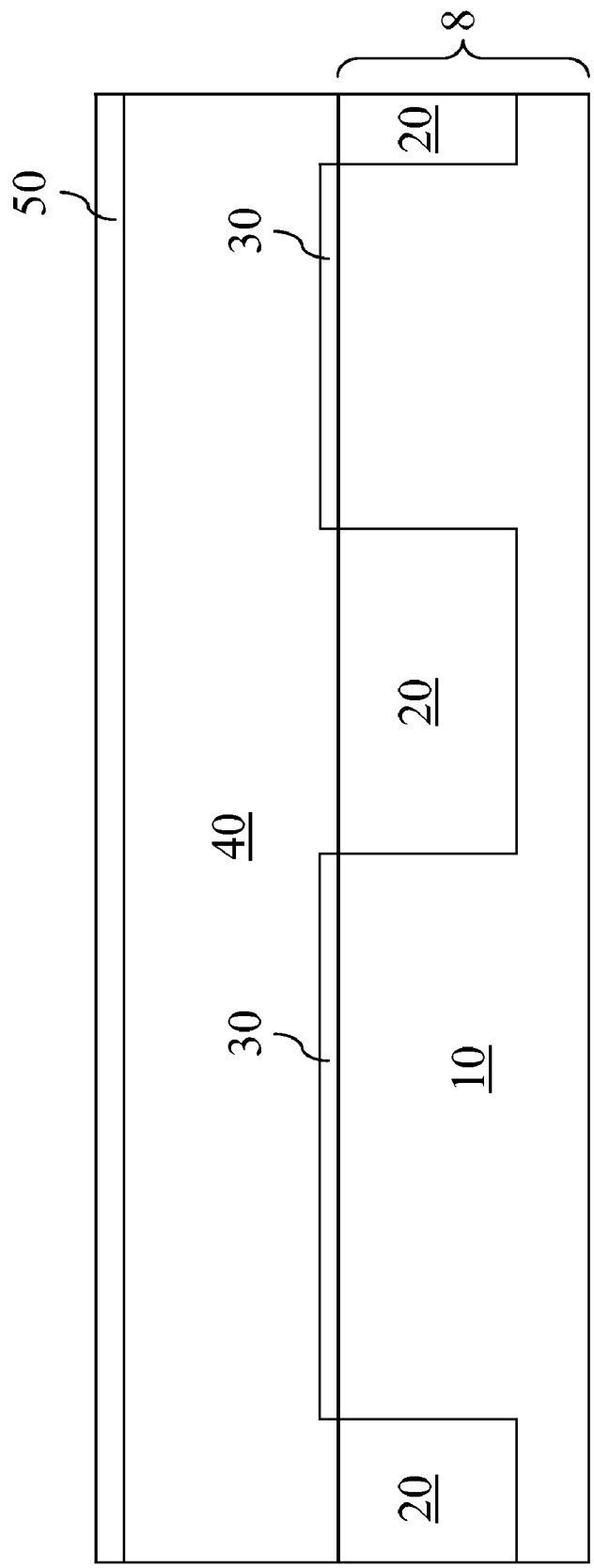

Referring to FIG. 3, the second semiconductor substrate 108 is bonded to the dielectric oxide layer 50 on the first semiconductor substrate 8 employing methods known in the art. For example, the second semiconductor substrate 108 may be brought to contact with the dielectric oxide layer 50 and annealed to promote adhesion of the dielectric oxide layer 50 to the second semiconductor substrate 108. The bonded substrate is separated at the hydrogen implanted layer 130 to release the third semiconductor layer 110. Methods of cleaving a bonded substrate at a hydrogen implanted layer by an anneal are well known in the art, and described, for example, in the above referenced U.S. Patents.

The surface orientation of the second semiconductor layer 120 after the bonding and the separation, which is shown as a "Z" direction, and a horizontal direction, which is shown as an "X" direction, are selected such that a crystallographic plane to be formed the second semiconductor layer 120 by a crystallographic anisotropic etch form a non-zero angle relative to the Z direction and the X direction. For example, if a crystallographic plane to be subsequently formed is one of {111} orientations, the Z direction may be one of {001} orientations and the X direction may be one of {110} orientations.

Figure 4A:
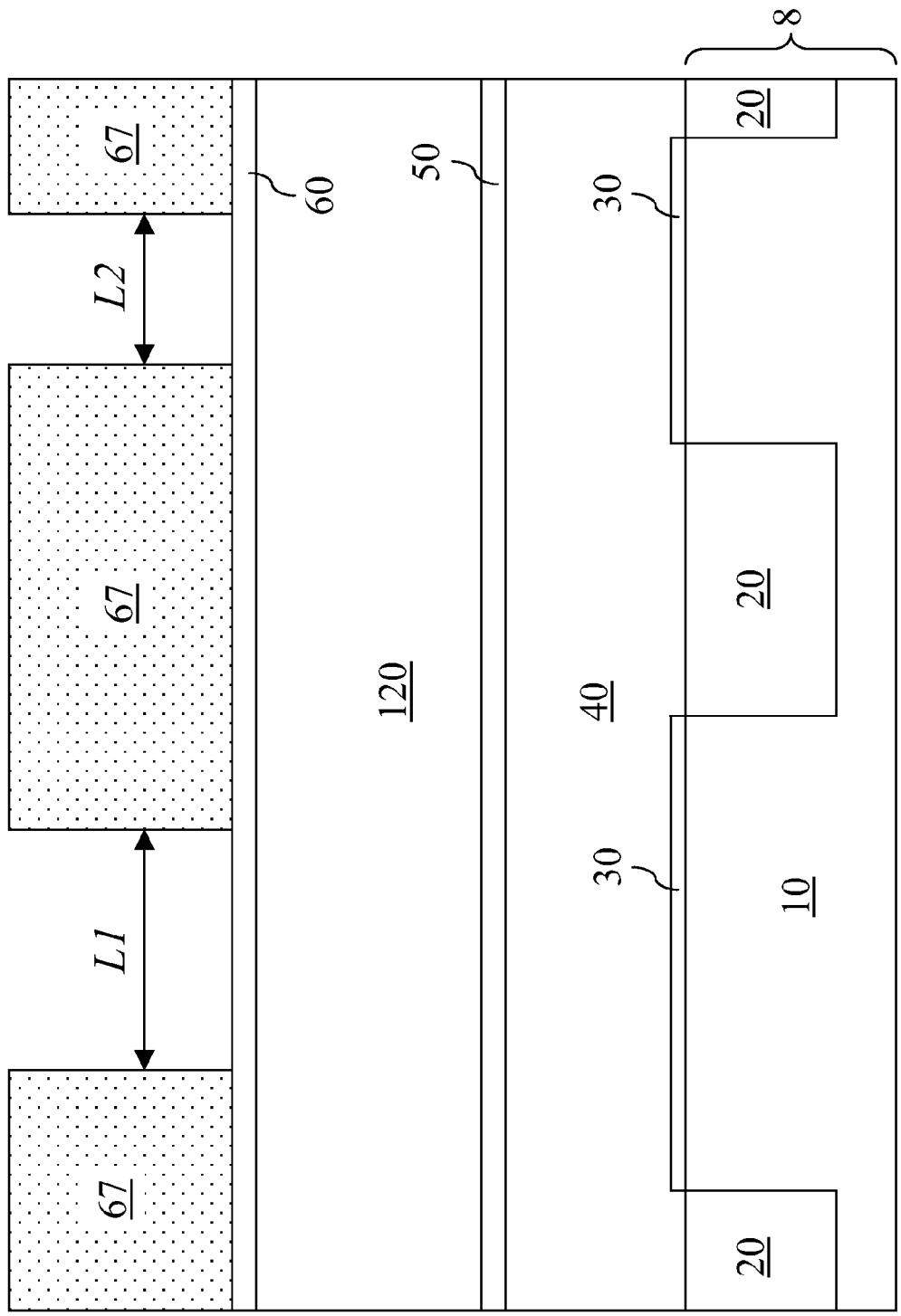
Figure 4B:
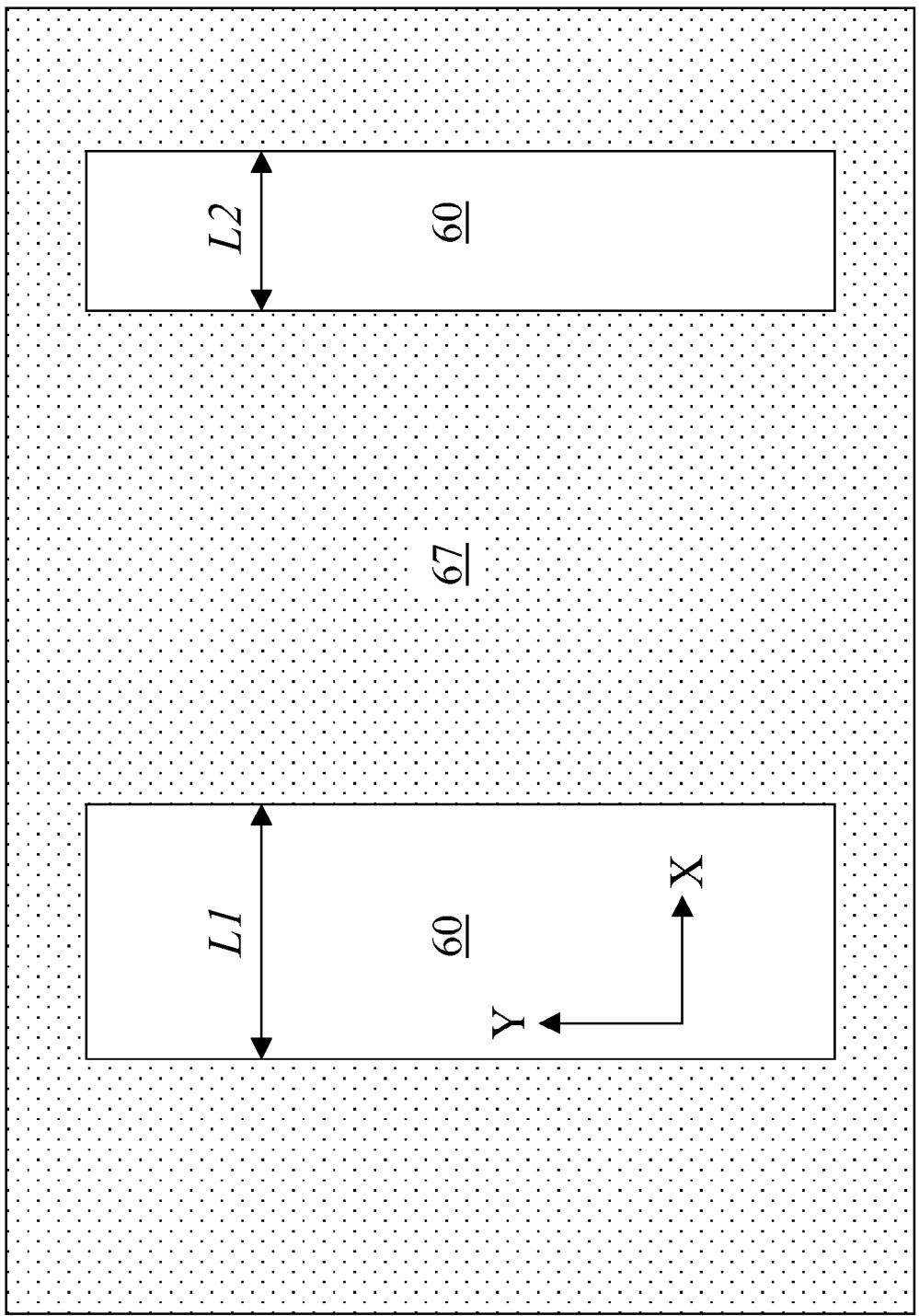
FIGS. 4B, 6B, and 10B are top down views of the exemplary semiconductor structure corresponding to FIGS. 4A, 6A, and 10A, respectively.

Referring to FIGS. 4A and 4B, a dielectric hardmask layer 60 is formed on the second semiconductor layer 120 by chemical vapor deposition or by thermal conversion of the second semiconductor layer 120. The dielectric hardmask layer 60 may comprise silicon oxide, silicon oxynitride, silicon nitride, or a ceramic nitride such as aluminum nitride, strontium nitride, boron nitride, and beryllium nitride. In case the dielectric hardmask layer 60 comprises silicon oxide, the dielectric hardmask layer 60 may be undoped as in undoped silicate glass (USG) or doped as in borosilicate glass (BSG), arsenosilicate glass (ASG), phosphosilicate glass (PSG), or fluorosilicate glass (FSG). The material and thickness of the dielectric hardmask layer 60 is selected to provide high selectivity to an anisotropic crystallographic etch to be subsequently employed so that a substantial portion of the dielectric hardmask layer 60 remains after the anisotropic crystallographic etch. The thickness of the dielectric hardmask layer 60 may be from about 5 nm to about 100 nm, and typically from about 20 nm to about 50 nm, although lesser and greater thickness are contemplated herein also.

A photoresist 67 is applied over the dielectric hardmask layer 60 and lithographically patterned to form a first line having a first width L1 and a second line having a second width L2. While the first line and the second line in the exemplary semiconductor structure run parallel to a "Y" direction, which is perpendicular to the X direction and the Z direction and is located in the plane of the top surface of the second semiconductor layer 120, lines may in general run in any direction that enables exposure of crystallographic facets consistent with the symmetry of the crystal structure of the second semiconductor layer 120. For example, if the crystallographic plane to be subsequently formed is one of {111} orientations and if the X direction is one of {110} orientations, lines may run in the X direction and/or in the Y direction. The direction of a line herein refers to the direction of a long edge of a rectangular opening in the photoresist 67. Preferably, the direction of edges of openings in the photoresist coincides with an intersection of a crystallographic plane to be formed and the top surface of the second semiconductor layer 120.

The first width L1 and the second width L2 may be the same or different. The first width L1 and/or the second width L2 may be a critical dimension, i.e., a minimum dimension that may be printed by available lithographic tools.

Figure 5:
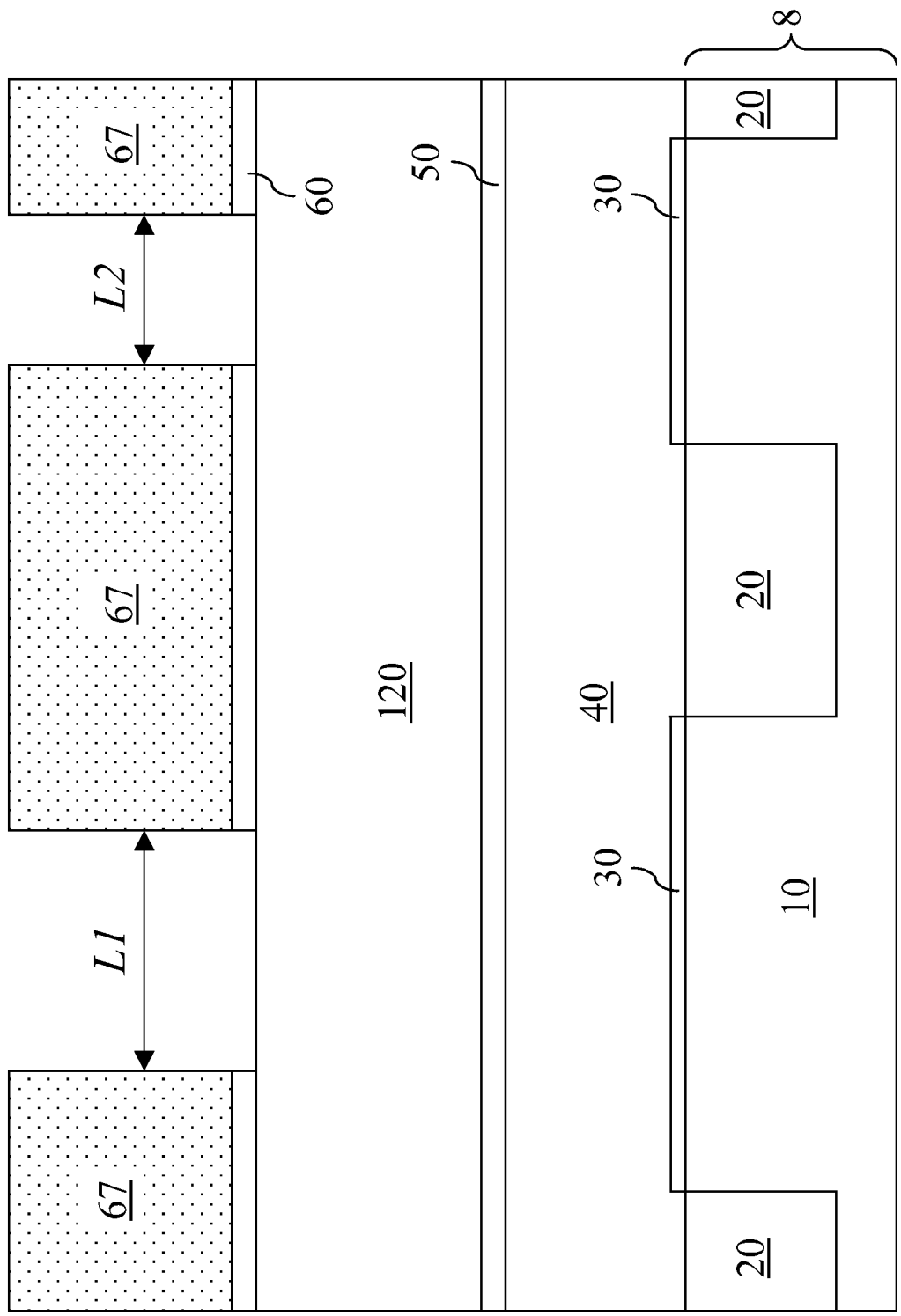

Referring to FIG. 5, exposed portions of the dielectric hardmask layer 60 are removed by a reactive ion etch so that the pattern in the photoresist 67 is transferred into the dielectric hardmask layer 60. Preferably, the reactive ion etch is selective to the second semiconductor layer 120. A wet etch may be employed instead of the reactive ion etch. The photoresist 67 is subsequently removed. A suitable surface clean may be performed at this point.

Figure 6A:
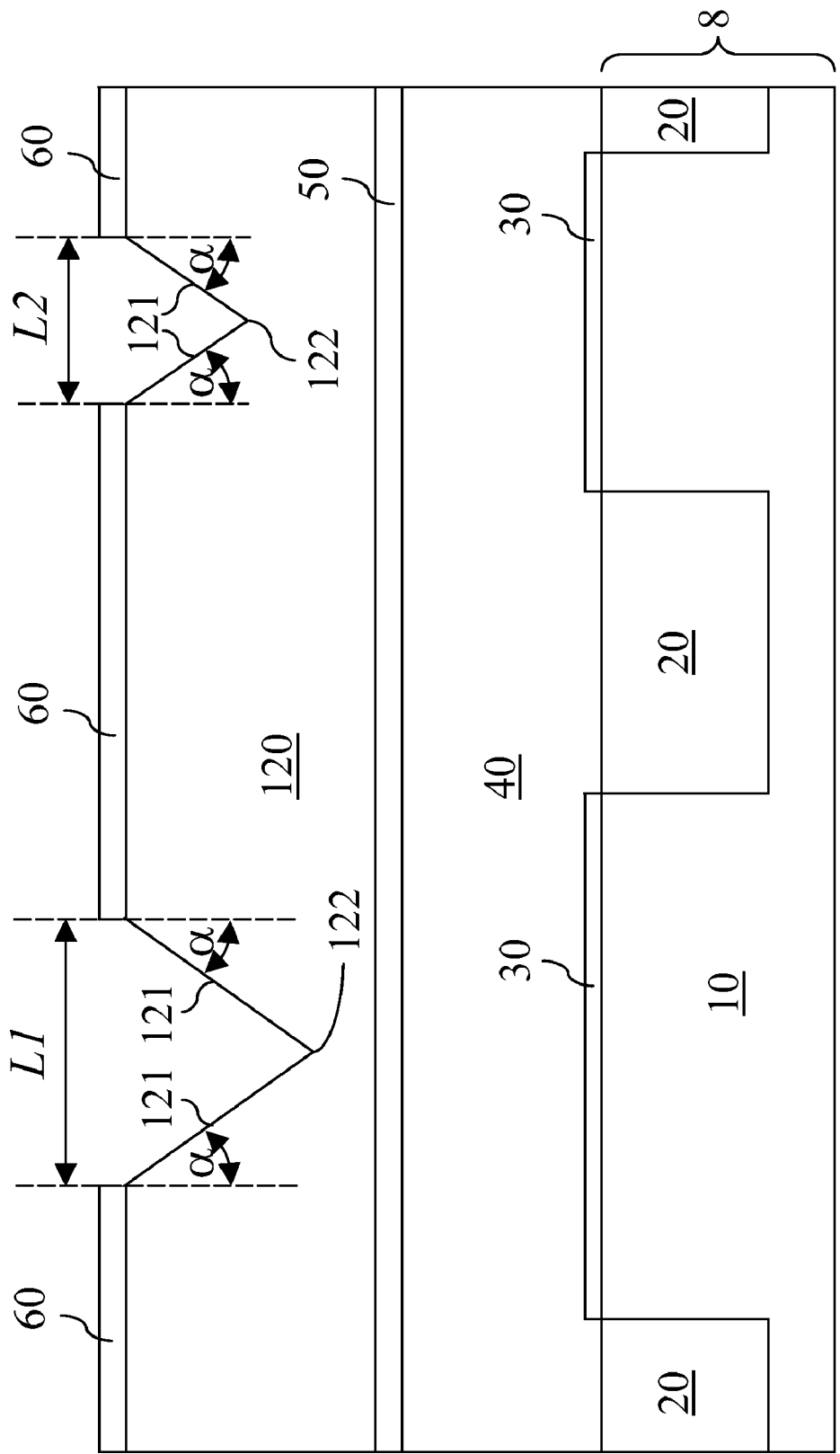
Figure 6B:
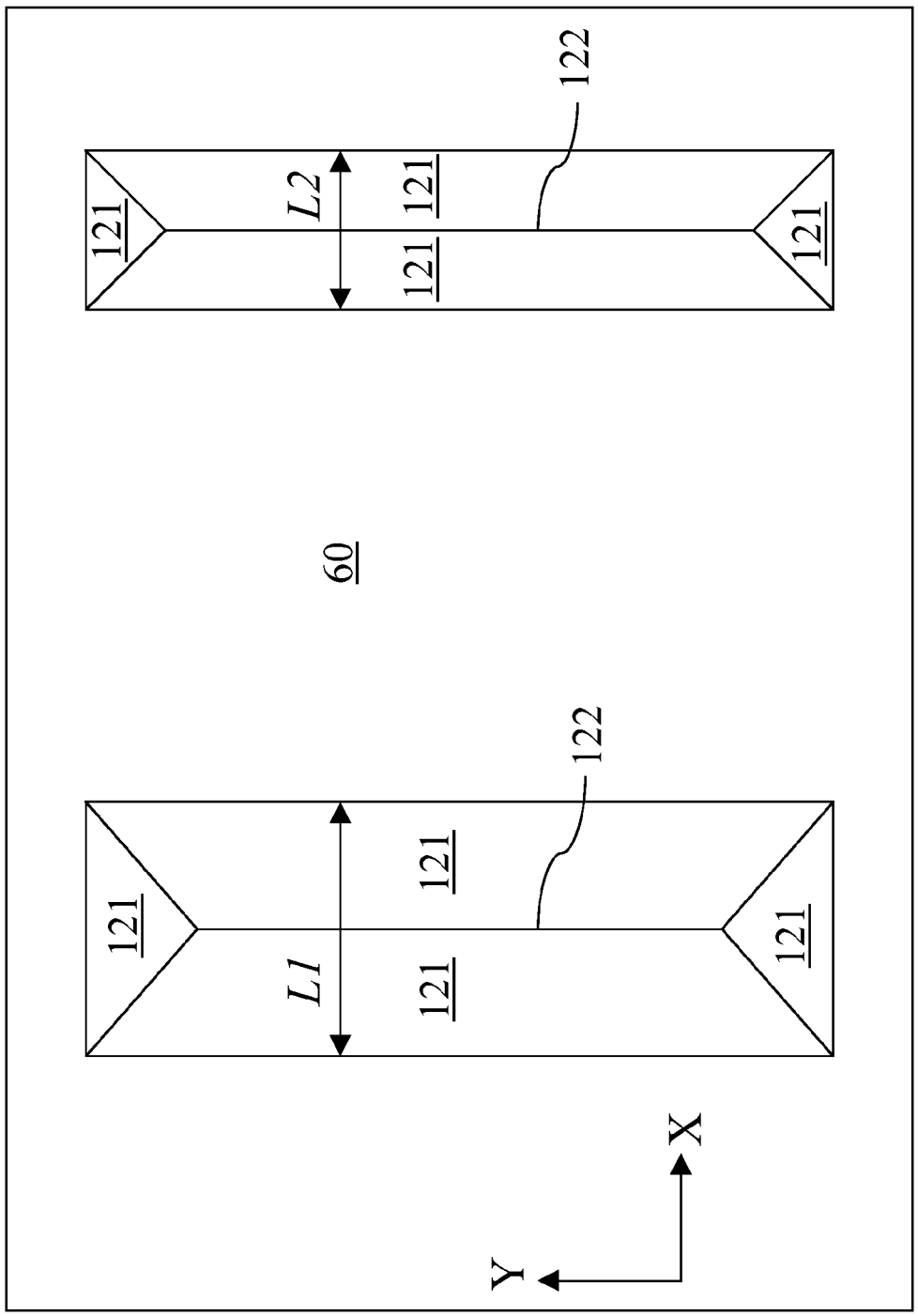

Referring to FIGS. 6A and 6B, an anisotropic crystallographic etch is performed to form crystallographic facets in the second semiconductor layer 120. Typically, the anisotropic crystallographic etch is a wet etch that etches a particular type of crystallographic planes slower than the rest of crystallographic planes.

Dependency of the etch rate of wet etching chemicals on the crystallographic orientations of the surface of semiconductors has been known in the art. Examples of engineering the wet etch chemistry to select the preferred orientations of the facet, or the resulting semiconductor surface, has been demonstrated in "Anisotropic Etching of Surfactant-Added TMAH Solution," MEMS '99, Jan. 1999, pp. 650-655, Sekimura. According to Sekimura, preferred orientations of the facet is engineered by adding surfactant to the wet etching chemical to achieve differences in the etch rate of the silicon by more than one order of magnitude.

Additionally, an alternative method of selecting the preferred orientations of the etched semiconductor surface by changing the surface treatment has also been demonstrated. In one example, the sidewalls of deep trenches were subjected to different surface pretreatment and then subjected to the same wet etching chemicals, specifically, dilute hydrogen fluoride (DHF) followed by ammonium hydroxide ($NH_4OH$). Different pretreatment of the surface resulted in different facets on the sidewalls of the deep trenches after the wet etch.

In one example, the second semiconductor layer 120 may comprise silicon, and the Z direction may be a (001) orientation, and the X direction may be a (110) orientation, and the Y direction may be a (1 $\bar{1}$ 0) orientation. Crystallographic facets having {111} orientations may be formed in this case. An example of forming {111} crystallographic facets by employing dilute ammonia or TMAH is disclosed by Weber et al., "A Novel Locally Engineered (111) V-channel MOSFET Architecture with Improved Drivability Characteristics for Low-Standby power (LSTP) CMOS Applications," 2005 Symposium on VLSI, 2005, pp. 156-157. In this case, the crystallographic facets 121 formed by the anisotropic crystallographic etch have {111} surface orientations, since the etch rate along the {111} orientations of a silicon substrate is slower than the etch rate along other crystallographic orientations by about an order of magnitude or more. A pair of crystallographic facets 121 having a trapezoidal surface area is formed in each opening in the dielectric hardmask layer 60. A ridge 122, which runs in the lengthwise direction of each opening, joins each pair of crystallographic facets 121 having a trapezoidal surface area within the opening in the dielectric hardmask layer 60.

Crystallographic facets having different surface orientations may be formed by altering chemistry of the anisotropic crystallographic etch and, optionally, crystallographic orientations of the second semiconductor layer 120. Etch chemistries producing {110} surface orientations are well known in the art. A first example of such a process is a wet etch process utilizing a pure TMAH solution, which produces {110} facets due to the higher rate of etching along {110} surface orientations than along {100} surface orientations. A second example is a wet etch process which comprises a pretreatment with SC1 clean consisting of a mixture of $H_2O$, $NH_4OH$, and $H_2O_2$, followed by etching in a dilute hydrofluoric acid (DHF), then followed by etching in an ammonium hydroxide solution ($NH_4OH$). This process also has higher etch rate along {110} surface orientations than along {100} surface orientations. A third example of a wet etch chemistry that produces {110} facets comprises 23.4% KOH, 63.3% H2O, and 13.3% isopropyl alcohol at 80 C, which produces an etch rate of 60 nm/min on {110} silicon surfaces and 1,000 μn/min on {100} silicon surfaces.

In general, major crystallographic orientations such as {100}, {111}, {211}, {221} and {311} orientations may be obtained for the crystallographic facets 121 by selecting a suitable semiconductor material for the second semiconductor layer 120 and by manipulating chemistry employed in the anisotropic crystallographic etch. The angle α of the crystallographic facets 121 from a vertical line depends on the surface orientation of a top surface of the second semiconductor layer 120 and the surface orientation of the crystallographic facets 121. For example, if the surface orientation of the second semiconductor layer 120, i.e., the crystallographic orientation of the second semiconductor layer 120 along the Z direction, is a (001) orientation, and if the surface orientations of the crystallographic facets 121 are {111} orientations, the angle α may be arccosine $(2/\sqrt{6}) \cong 35.26°$. The dielectric hardmask layer 60 is subsequently removed, for example, by a wet etch.

Figure 7:
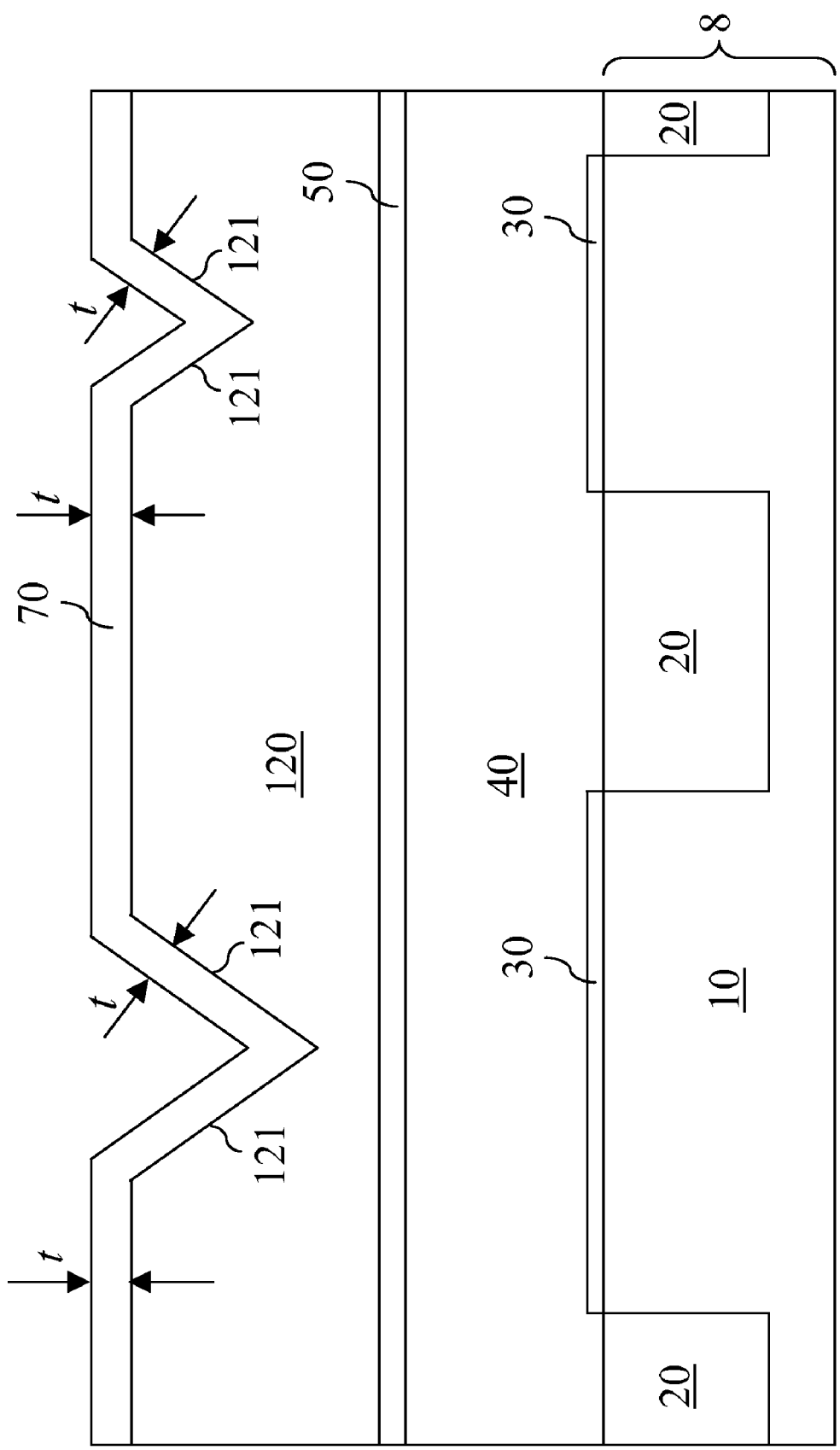

Referring to FIG. 7, a masking material layer 70 is formed on the surfaces of the second semiconductor layer 120 including the crystallographic facets 121 by a conformal deposition. Exemplary methods for conformal deposition includes low pressure chemical vapor deposition (LPCVD), rapid thermal chemical vapor deposition (RTCVD), plasma enhanced chemical vapor deposition (PECVD), high density plasma chemical vapor deposition (HDPCVD), and sub-atmospheric chemical vapor deposition (SACVD). A deposition method having a high conformity in a deposited film, such as low pressure chemical vapor deposition (LPCVD), is preferred.

The masking material layer 70 may comprise a dielectric nitride, which includes silicon nitride or a ceramic nitride such as aluminum nitride, strontium nitride, boron nitride, and beryllium nitride. The thickness t of the masking material layer 70 may be from about 2 nm to about 100 nm, and preferably from about 5 nm to about 30 nm, although lesser and greater thicknesses are explicitly contemplated herein also. Since the deposition process for the masking material layer 70 is conformal, the thickness t of the masking material layer 70 is substantially the same irrespective of the location of measurement including the portions of the masking material layer 70 directly above the crystallographic facets 121.

Alternately, the masking material layer 70 may comprise an undoped silicon-containing-semiconductor material such as undoped amorphous silicon, undoped polysilicon, undoped amorphous silicon germanium alloy, undoped polycrystalline silicon germanium alloy, undoped amorphous silicon carbon alloy, undoped polycrystalline silicon carbon alloy, undoped amorphous silicon germanium carbon alloy, and polycrystalline undoped silicon germanium carbon alloy. In general, the undoped silicon-containing-semiconductor material comprises one of group IV elements or an alloy thereof in amorphous or polycrystalline form.

Figure 8:
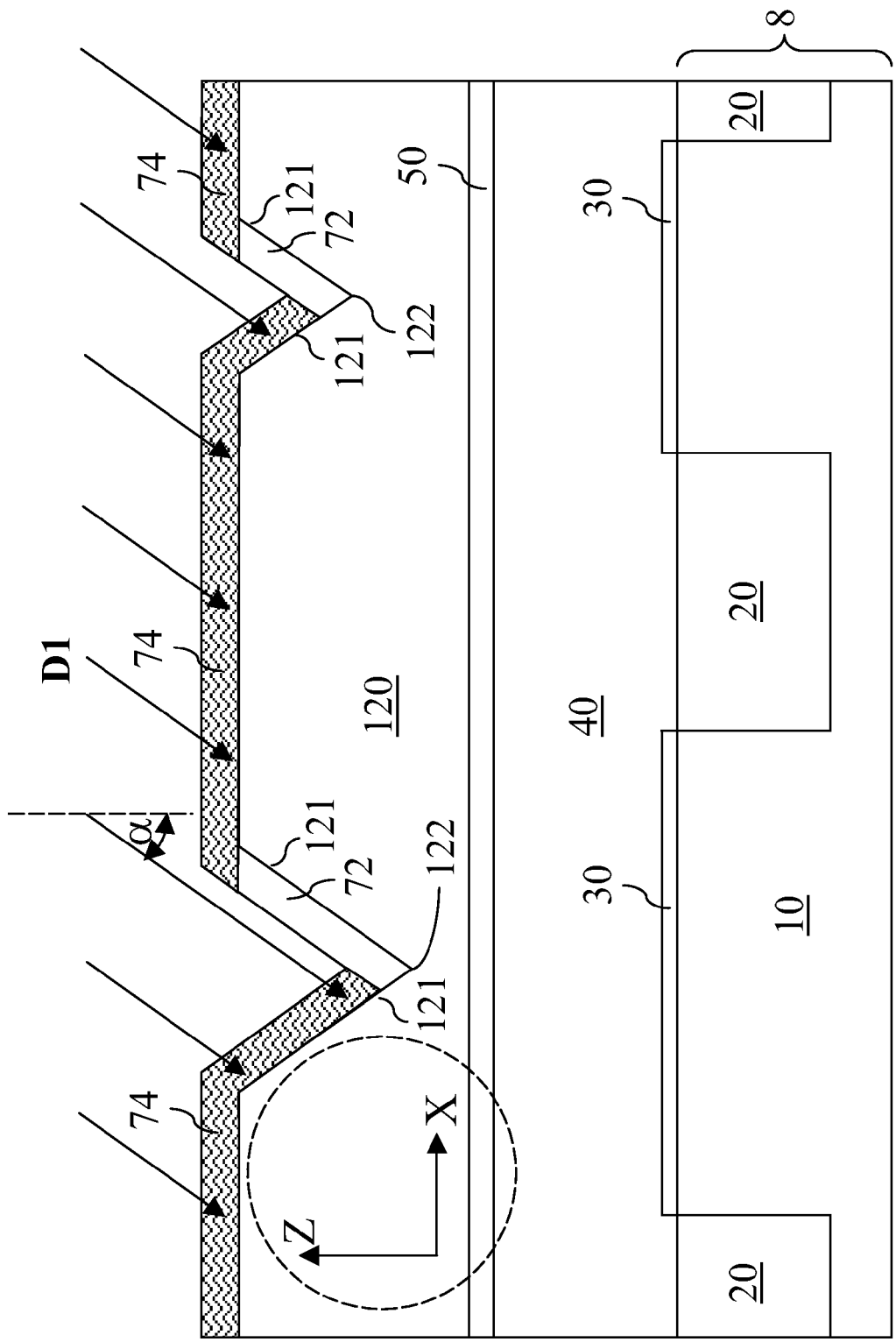

Referring to FIG. 8, Ge, B, Ga, In, As, P, Sb, or inert atoms are implanted into the masking material layer 70 at an angle $\alpha$ from a vertical line in a first direction D1 so that the direction of the angled implantation is parallel to one of the crystallographic facets 121 having a trapezoidal surface area. In this case, the direction of the ion implantation is confined within the plane that contains the X direction and the Z direction, i.e., the direction of the angled ion implantation does not contain a vector in the Y direction. The Ge, B, Ga, In, As, P, Sb, or inert atoms may comprise Ge atoms, inert atoms, or a mixture of Ge atoms and inert atoms. The inert atoms comprise at least one of Ne, Ar, Kr, Xe, and Rn.

The dose of the Ge, B, Ga, In, As, P, Sb, or inert atoms is selected to provide enough structural damage to portions of the masking material layer 70 that are implanted with the Ge, B, Ga, In, As, P, Sb, or inert atoms, which are herein referred to as "implantation-damaged masking material portions" 74, so that an etch rate of the implantation-damaged masking material portions 74 by an etchant becomes substantially higher than the etch rate of portions of the masking material layer 70 that are not implanted with the Ge, B, Ga, In, As, P, Sb, or inert atoms, which are herein referred to as "undamaged masking material portions" 72, by the same etchant. The energy of the Ge, B, Ga, In, As, P, Sb, or inert atoms is selected so that the implanted Ge, B, Ga, In, As, P, Sb, or inert atoms does not provide sufficient damage to portions of the masking material layer 70 around the ridges 122 where two crystallographic facets 121 having trapezoidal surface areas are adjoined.

In one embodiment, the etch rate differential between the implantation-damaged masking material portions 74 and the unimplanted portion of the masking material layer 70 is induced by the structural damages induced in the implantation-damaged masking material portions 74. The implantation-damaged masking material portion 74 may comprise a dielectric nitride and at least one of Ge or inert atoms, and the implantation-damaged masking material portion 74 has more structural damage than the undamaged masking material portion of the masking material layer 70.

In another embodiment, the etch rate differential between the implantation-damaged masking material portions 74 and the unimplanted portion of the masking material layer 70 is induced by the structural damages induced in the implantation-damaged masking material portions 74. The implantation-damaged masking material portion 74 comprises an undoped silicon-containing-semiconductor material and at least one of Ge, B, Ga, In, As, P, and Sb, wherein the undamaged masking material portion of the masking material layer 70 is substantially undoped. The differences in the doping allows selective etching of the implantation-damaged masking material portion 74, while preserving the undamaged masking material portion of the masking material layer 70 in an etch having dopant concentration dependent etch rates. Etch chemistries are known in the art that induce a variation in the etch rate of 1-3 orders of magnitude depending on the doping concentration of a semiconductor material.

Figure 9:
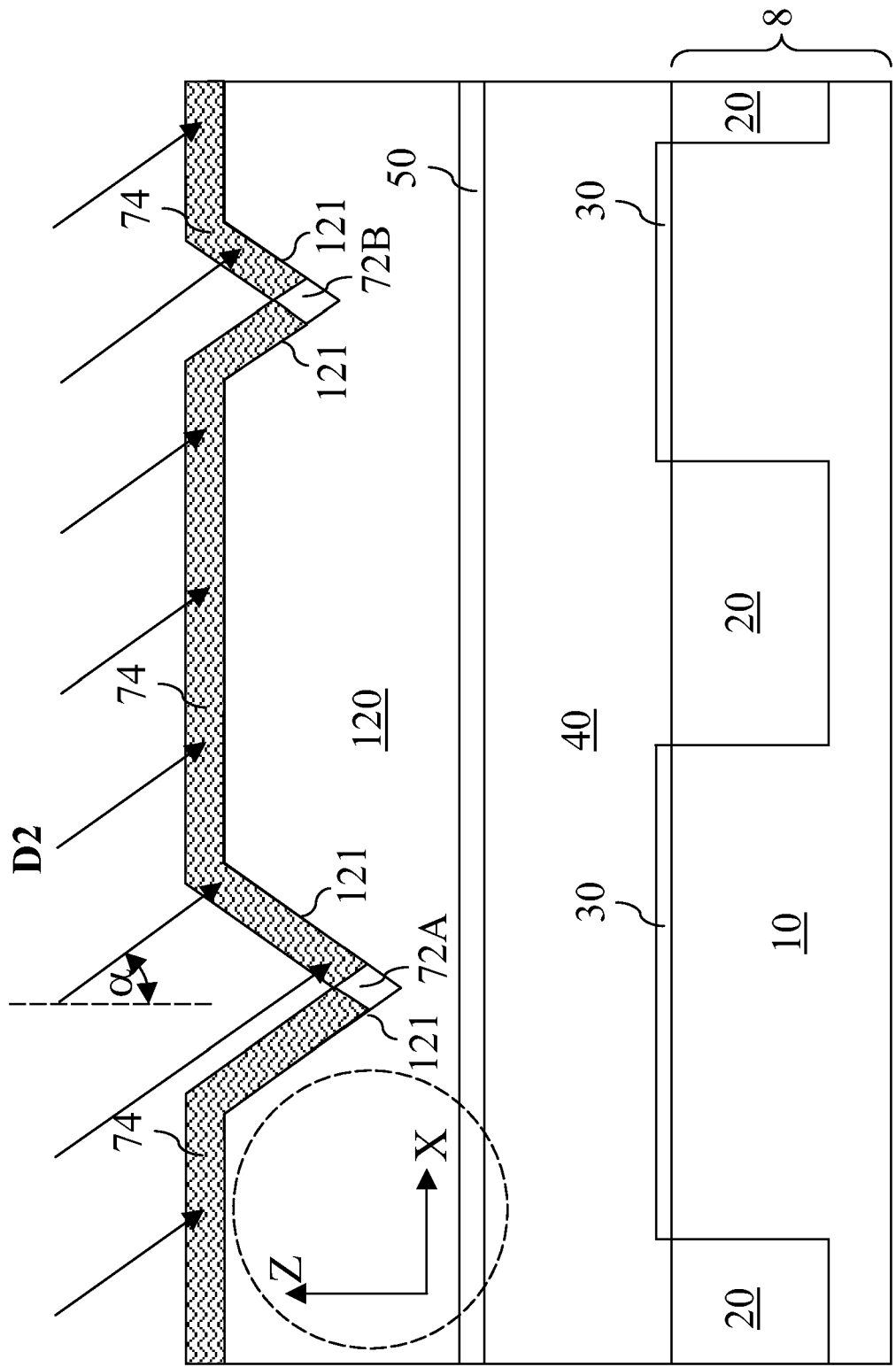

Referring to FIG. 9, more Ge, B, Ga, In, As, P, Sb, or inert atoms are implanted into the masking material layer 70 at an angle $\alpha$ from a vertical line in a second direction D2, which is a minor image of the first direction D1 about the plane defined by the Y direction and the Z direction, so that the direction of the angled implantation is parallel to another of the crystallographic facets 121 having a trapezoidal surface area. The direction of the ion implantation is confined within the plane that contains the X direction and the Z direction, i.e., the direction of the angled ion implantation does not contain a vector in the Y direction.

The two rounds of implantations of Ge, B, Ga, In, As, P, Sb, or inert atoms forms implantation-damaged masking material portions 74 on all crystallographic facets 121. A portion of the masking material layer 70 located directly on ridges 122 where two crystallographic facets 121 having trapezoidal surface areas are adjoined to each other, however, is protected from the Fe or inert atom during both ion implantation steps due to the geometry involving the directions (D1, D2) of the ion implantation. The undamaged masking material portion formed in the area of the opening having a first width L1 and formed in the dielectric hardmask layer 60 (See FIGS. 6A and 6B) is herein referred to as a first undamaged masking material portion 72A. The undamaged masking material portion formed in the area of the opening having a second width L2 and formed in the dielectric hardmask layer 60 (See FIGS. 6A and 6B) is herein referred to as a second undamaged masking material portion 72B. The first and second undamaged masking material portions (72A, 72B) run along the Y direction and have a constant vertical cross-sectional area having the shape of a rhombus in a vertical cross-section in the plane of X direction and the Z direction. The two corners of the rhombus have an angle of $2\alpha$, i.e., an angle that is equal to twice the value of the angle $\alpha$. Further, since the thickness of the masking material layer 70 is independent of location, the shape and size of the vertical cross-sectional area of the first and second undamaged masking material portions (72A, 72B) are independent of the location of the cross-section.

Figure 10A:
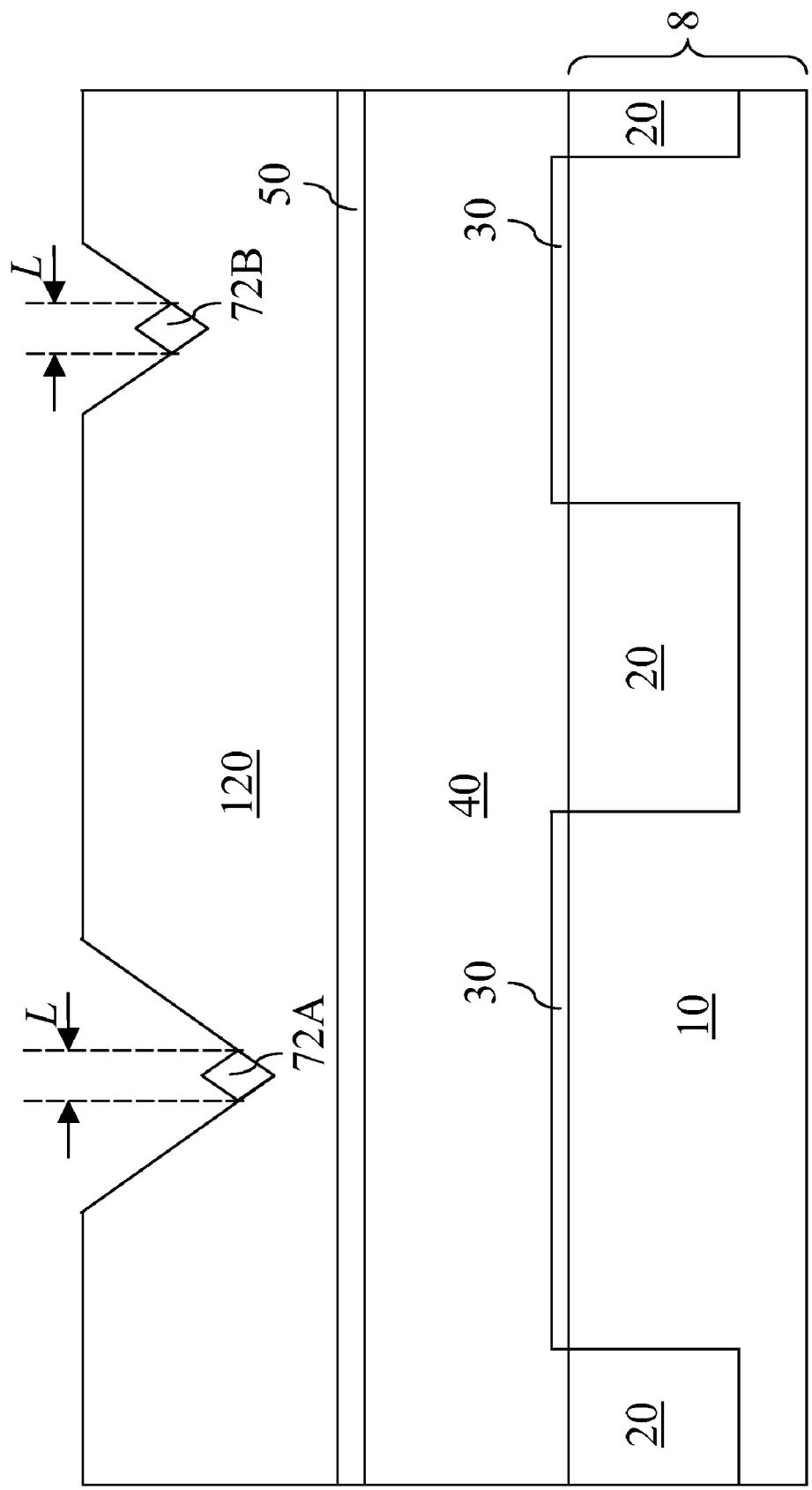
Figure 10B:
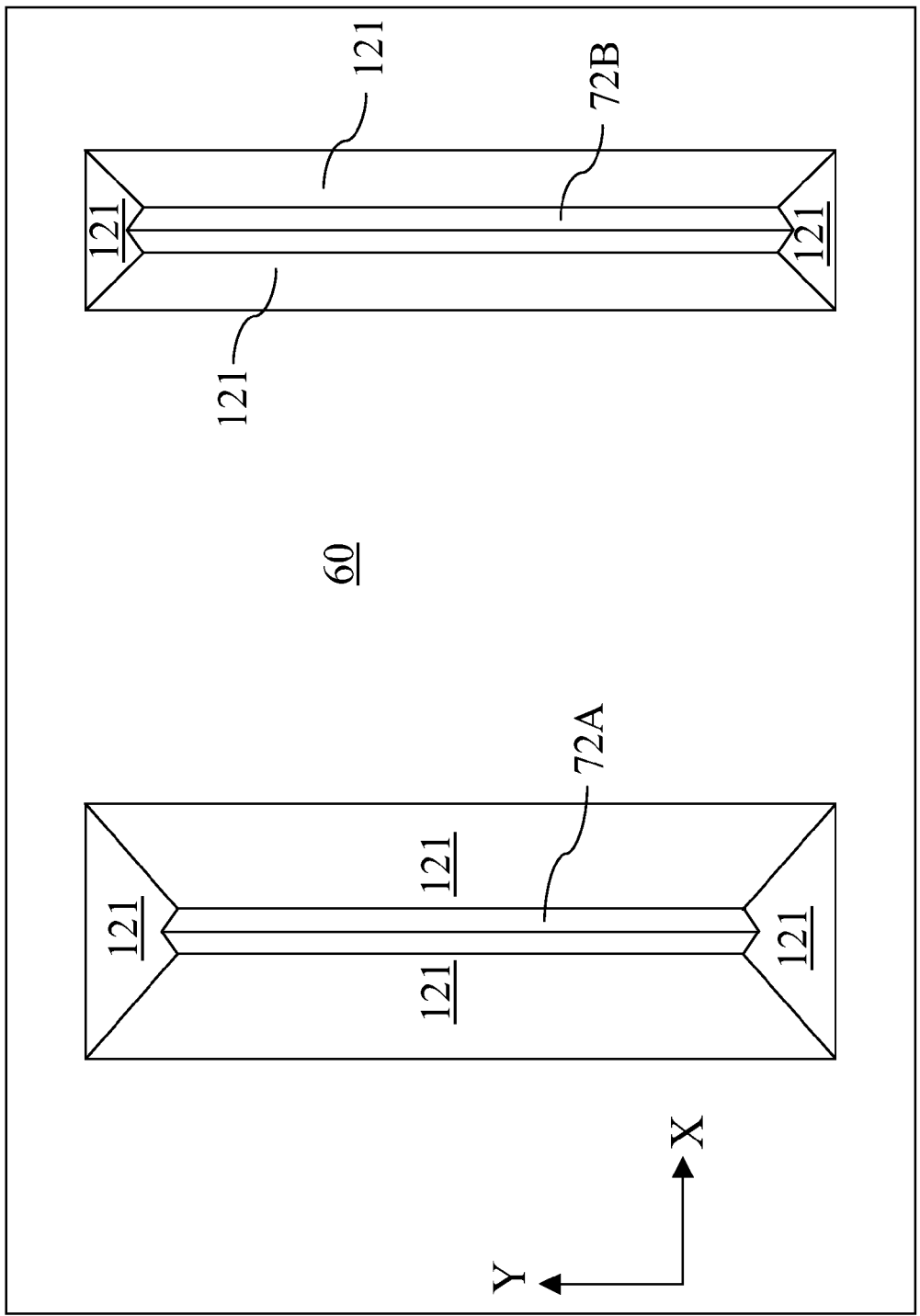

Referring to FIGS. 10A and 10B, implantation-damaged masking material portions 74 are removed selective to the first and second undamaged masking material portions (72A, 72B) in an etch, which may be a wet etch or a dry etch. Due to the structural damages in the implantation-damaged masking material portions 74 caused by the Ge, B, Ga, In, As, P, Sb, or inert atoms, the etch rate of the implantation-damaged masking material portions 74 is higher than the etch rate of the first and second undamaged masking material portions (72A, 72B). Preferably, an etch chemistry that amplifies the difference in the etch rates between the damaged and undamaged portions is employed. For example, the etch may be a wet etch employing a hydrofluoric acid, ethylene glycol, phosphoric acid, hydrogen peroxide, ammonium hydroxide, or a combination thereof. Differences in structural damage and/or doping between the implantation-damaged masking material portions 74 and the first and second undamaged masking material portions (72A, 72B) provides the selectivity of the etch chemistry. For the case of using poly-Si as mask material, laser annealing is applied for activating n-type dopants without causing large dopant diffusion. After the laser annealing, a reactive ion etch or a wet etch is employed to remove the implantation-damaged masking material portions 74 comprising doped polycrystalline silicon-containing-semiconductor selective to the first and second undamaged masking material portions (72A, 72B) which comprise undoped polycrystalline silicon-containing-semiconductor.

From the geometry of the configuration, a lateral width L of the rhombus, which is the horizontal distance between two apexes of the rhombus at the same height, is readily calculated to be $t/(\cosine\ \alpha)$. Thus, the lateral width L of the rhombus is not determined by lithographic limitations, but is determined by the thickness of the masking material layer 70. In other words, the lateral width L of the rhombus is independent of lithographic variations and limitations, and thus, a sublithographic dimension can be readily achieved for the lateral width L of the rhombus. For example, the thickness t of the masking material layer 70 may be from about 2 nm to about 10 nm, and the corresponding lateral width L of the rhombus may be from about 3 nm to about 20 nm, which is much less than any dimension that may be produced lithographically. In addition, the width of the first and second undamaged masking material portions (72A, 72B), which is the lateral width L of the rhombus, is constant throughout the exemplary semiconductor surface since the variation in the width of the first and second undamaged masking material portions (72A, 72B) arises only from variations in the thickness t of the masking material layer 70 and local variations in the etch rate that are typically much less than lithographic variations.

Figure 11:
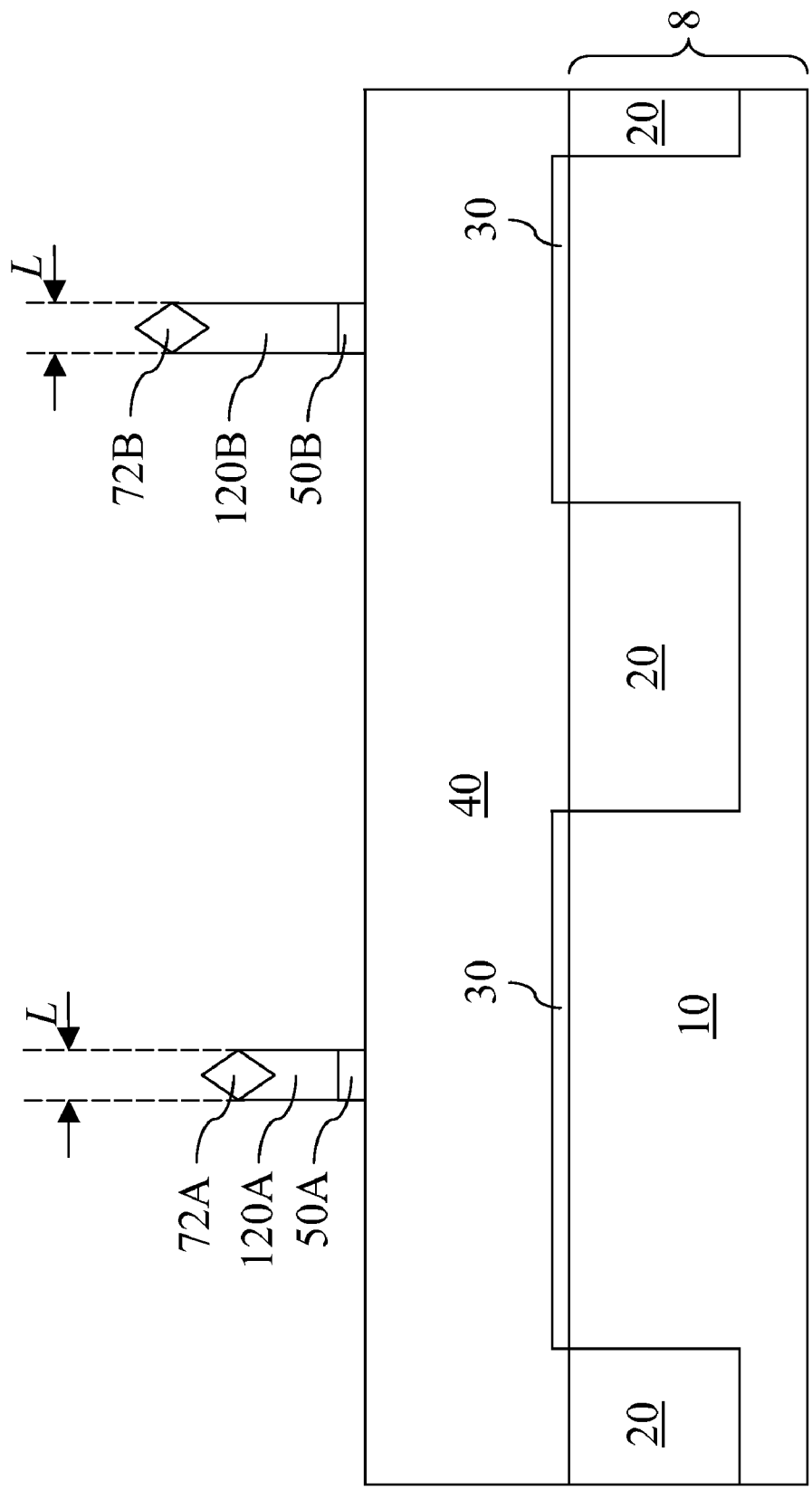

Referring to FIG. 11, the second semiconductor layer 120 is etched by an anisotropic reactive ion etch employing the first and second undamaged masking material portions (72A, 72B) as an etch mask. A first semiconductor portion 120A and a second semiconductor portion 120B are formed directly underneath the first undamaged masking material portions 72A and the second undamaged masking material portion 72B, respectively, from remaining portions of the second semiconductor layer 120. The first and second undamaged masking material portions (72A, 72B) and/or the first and second semiconductor portions (120A, 120B) are employed as an etch mask to etch the dielectric oxide layer 50 to form a first dielectric oxide portion 50A and a second dielectric oxide portion 50B. The width of the first and second dielectric oxide portions (50A, 50B) and the first and second semiconductor portions (120A, 120B) is substantially the same as the lateral width L of the rhombus, which is the width of the first and second undamaged masking material portions (72A, 72B).

Figure 12:
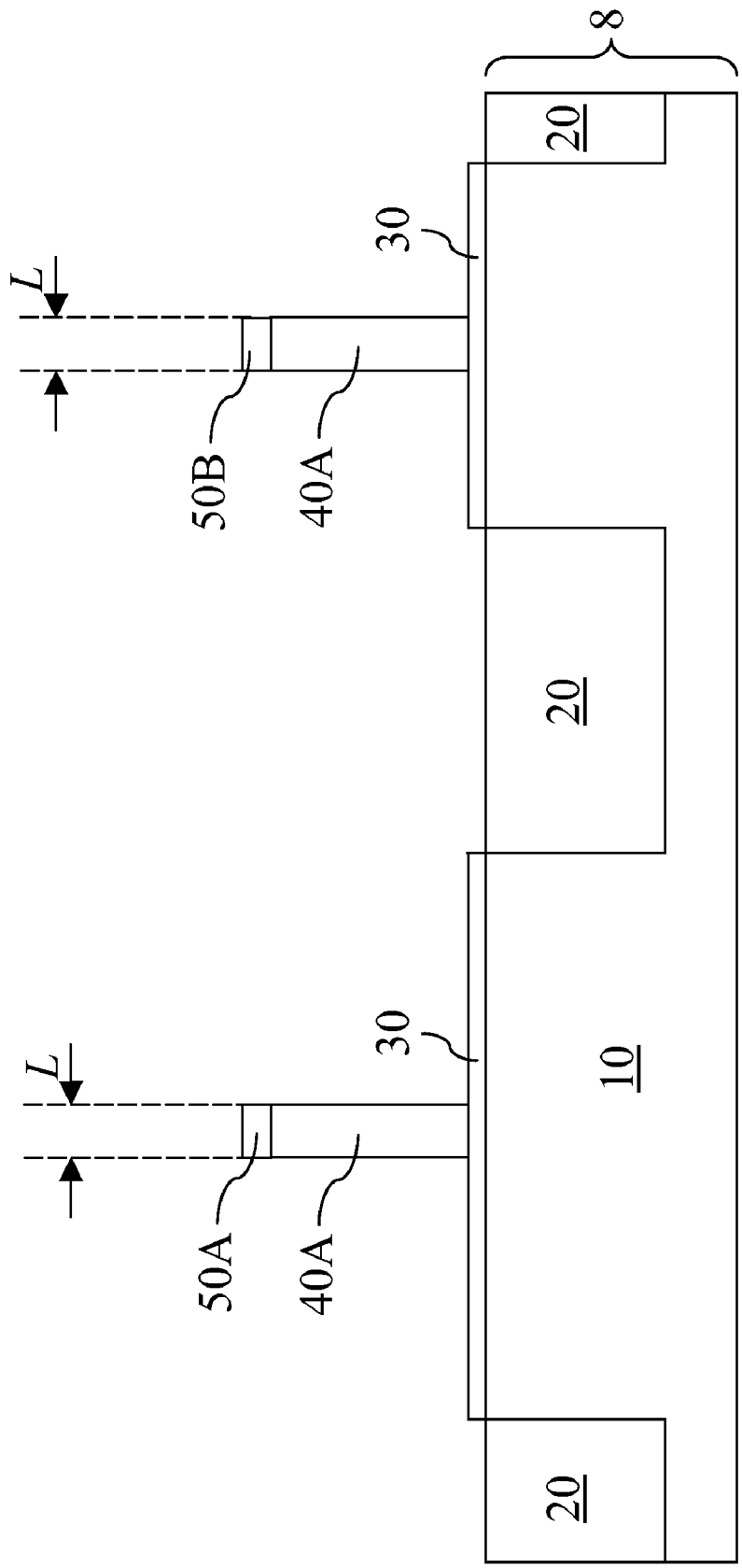

Referring to FIG. 12, the first and second dielectric oxide portions (50A, 50B) are employed as an etch mask, either alone or in combination with at least one of the first and second undamaged masking material portions (72A, 72B) and the first and second semiconductor portions (120A, 120B), to transfer the pattern of the first and second dielectric oxide portions (50A, 50B) into the gate conductor layer 40 to form a first gate conductor line 40A and a second gate conductor line 40B. The first and second undamaged masking material portions (72A, 72B) and the first and second semiconductor portions (120A, 120B) may, or may not, be removed prior to a reactive ion etch that is employed to remove exposed portions of the gate conductor layer 40. The first and second gate conductor lines (40A, 40B) have substantially the same width as the lateral width L of the rhombus, which is the width of the first and second undamaged masking material portions (72A, 72B). Thus, the first and second gate conductor lines (40A, 40B) may have sublithographic dimensions.

Figure 13:
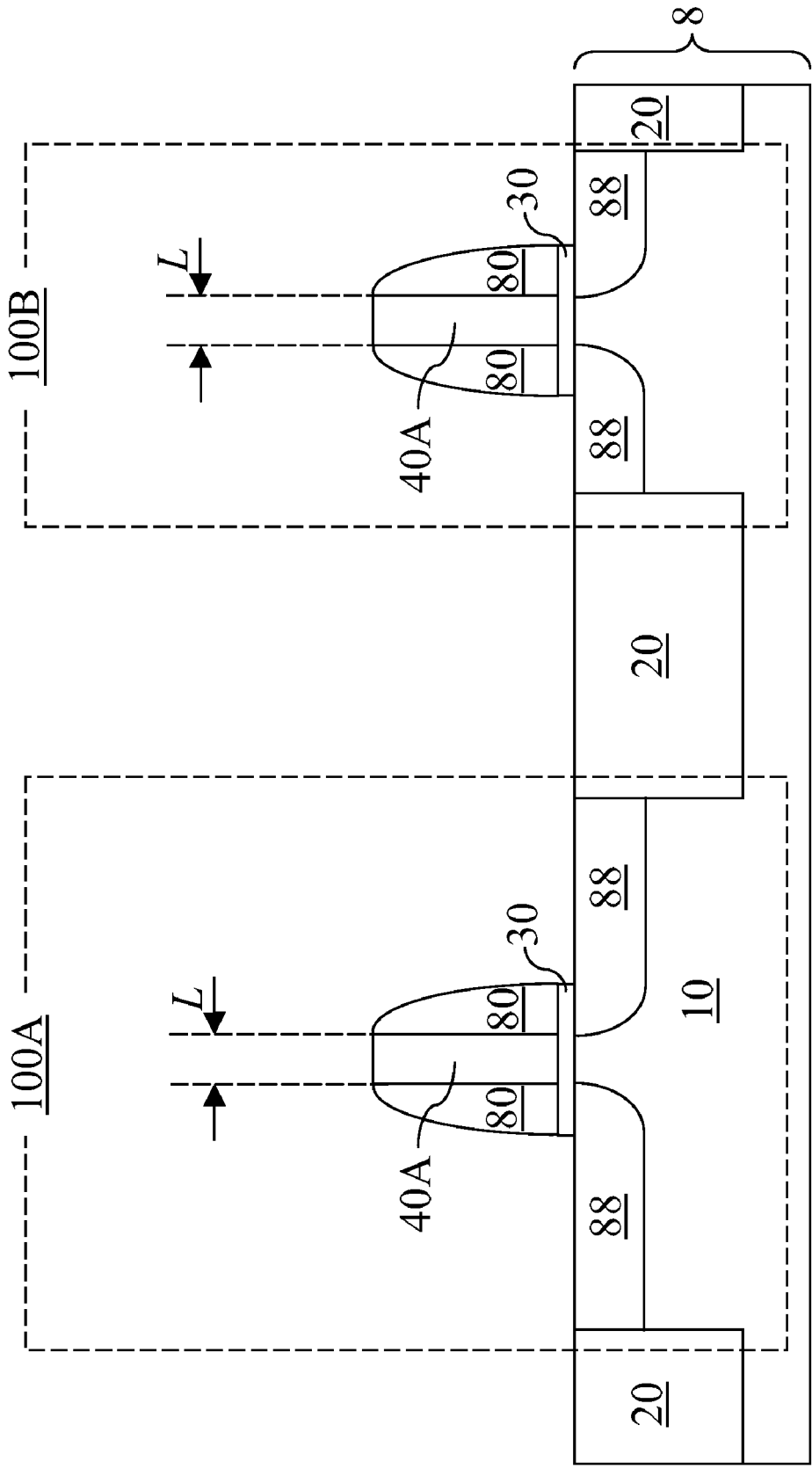

Referring to FIG. 13, conventional processing steps may be employed to form gate dielectric spacers 80 and source and drain regions 88 in each of a first device region 100A and a second device region 100B. The first and second dielectric oxide portions (50A, 50B) are removed at a suitable point in the processing sequence. Despite the variations in the dimension of the opening in the dielectric hardmask layer 60 (See FIGS. 6A and 6B) as formed by lithographic means, the first and second gate conductor lines (40A, 40B) have substantially the same width, which is the lateral width L of the rhombus, i.e., the width of the first and second undamaged masking material portions (72A, 72B), and may be a sublithographic dimension.

Thus, the present invention provides a method of forming features having dimensions that are lithography independent and uniform across the first semiconductor substrate 8, as well as allowing the manufacture of features having sublithographic dimensions that are not affected by lithographic variations.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
    forming a stack, from bottom to top, of a gate dielectric layer, a gate conductor layer, a dielectric material layer, and a semiconductor layer on a semiconductor substrate;
    forming crystallographic facets joined by a ridge in said semiconductor layer by an anisotropic wet etch;
    forming a masking material layer on said crystallographic facets; forming implantation-damaged masking material portions by implanting dopant atoms or inert atoms into said masking material layer, whereby a portion of said masking material layer is not implanted by said dopant atoms or inert atoms to form an undamaged masking material portion; and
    removing an entirety of said implantation-damaged masking material portions selective to said undamaged masking material portion by employing an etch chemistry that provides different etch rates between said implantation-damaged masking material portions and said undamaged masking material portion;
    etching said semiconductor layer, said dielectric material layer employing said undamaged masking material portion as an etch mask.

2. The method of claim 1, further comprising etching said gate conductor layer employing at least one of said undamaged masking material portions and a remaining portion of said dielectric material layer as an etch mask.

3. The method of claim 1, further comprising:
    transferring a pattern of said undamaged masking material portion into said gate conductor layer to form a gate conductor line; and
    forming a field effect transistor, wherein said gate electrode line is a gate electrode of said field effect transistor.

4. The method of claim 1, wherein a vertical cross-sectional area of said undamaged masking material portion is a rhombus.

5. The method of claim 1, further comprising:
    forming a dielectric hardmask layer directly on said semiconductor layer; and
    forming an opening in said dielectric hardmask layer, wherein said crystallographic facets are formed underneath said opening.

* * * * *